(12) United States Patent
Ranadive

(10) Patent No.: US 6,392,159 B1
(45) Date of Patent: May 21, 2002

(54) EMBEDDED STRUCTURE FOR ENGINEERING CHANGE AND REPAIR OF CIRCUIT BOARDS

(75) Inventor: Nandu Ranadive, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/362,273

(22) Filed: Jul. 27, 1999

(51) Int. Cl.[7] .................................................. H05K 1/16
(52) U.S. Cl. ....................... 174/260; 174/52.3; 174/261
(58) Field of Search ................................ 174/262, 263, 174/264, 265, 266, 261; 361/792, 793, 794, 795

(56) References Cited

U.S. PATENT DOCUMENTS

| | | |
|---|---|---|
| 4,489,364 A | 12/1984 | Chance et al. |
| 4,630,096 A | 12/1986 | Drye et al. |
| 4,748,495 A | 5/1988 | Kucharek |
| 5,280,413 A * | 1/1994 | Pai .............................. 361/792 |
| 5,294,754 A | 3/1994 | Wu |
| 5,315,486 A * | 5/1994 | Fillion et al. ................ 361/795 |
| 5,354,955 A | 10/1994 | Gregor et al. |
| 5,508,938 A | 4/1996 | Wheeler |

* cited by examiner

*Primary Examiner*—Kamand Cuneo
(74) *Attorney, Agent, or Firm*—Jay H. Anderson

(57) ABSTRACT

A circuit board structure is described for facilitating engineering changes for a multichip module mounted on the circuit board. The structure includes a first layer of a conductive material overlying a portion of a surface of the circuit board, and a second layer overlying the first layer and in contact therewith. The second layer has openings therein; bonding pads are formed in the openings of the second layer. The bonding pads are of a conductive material and in contact with the first layer. The multichip module is surrounded by a hermetic seal on the second layer, so that a first bonding pad is inside a hermetically sealed area of the circuit board and a second bonding pad is outside the hermetically sealed area. An engineering change of the multichip module is performed by connecting the multichip module to the first bonding pad by a first wire inside the hermetically sealed area, and by connecting a second wire to the second bonding pad outside the hermetically sealed area.

8 Claims, 5 Drawing Sheets

EMBEDDED STRUCTURE FOR ENGINEERING CHANGE AND REPAIR OF CIRCUIT BOARDS

FIELD OF THE INVENTION

This invention relates to engineering change (EC) and wire repair of circuit boards, and more particularly to a structure for facilitating ECs and repairs on boards having multichip modules (MCMs) mounted thereon.

BACKGROUND OF THE INVENTION

In the manufacture of computing hardware with complementary MOS (CMOS) technology, multichip modules (MCMs) are often mounted on circuit boards. A circuit board may be mounted between two aluminum plates for added mechanical strength. These plates, called stiffeners, have windows cut in them to provide space for components. A typical arrangement of an MCM mounted on a board with stiffeners is shown schematically in a cross-sectional view in FIG. 1. In this arrangement, an MCM 1 is mounted on a circuit board 2, with the board placed between a front stiffener 3 and a rear stiffener 4. Windows in the stiffeners provide space for the MCM 1 and other components (for example, power connectors 5).

The level of power dissipation by the components may be high enough to require liquid cooling of the MCMs. This may be accomplished using an arrangement shown in FIG. 2. A cooling liquid circulates through a cooling assembly 20 in contact with a cold plate 21 which in turn is in contact with the MCM 1. The temperature at or near the circuit board 2 in the vicinity of the MCM will thus typically be below the dew point of the ambient air. The cold plate is surrounded by a container of desiccant material 22, to prevent condensation from forming on the MCM or the circuit board. Furthermore, in order to provide a cool air space 23 close to the circuit board and the MCM which is also free of condensation, it is necessary to seal the area of the board surrounding the MCM and to circulate dry air through this space. Since the back side of the circuit board is also expected to be below the dew point of the ambient air, it is necessary to seal the back side of the board as well. This is accomplished by using O-rings 24 between the board and the stiffeners, and a gasket 25 between the cooling assembly 20 and the front stiffener 3. A sealing plate 26 seals the back side of the board, forming an air space 27.

In order to make engineering changes (ECs) and repairs to the modules, it is necessary to run wires between various points on the board surface. However, if the board is cooled and sealed against the stiffeners as described above, the O-ring will prevent external wires from being led from a point inside a module location to a point outside. A conventional method of overcoming this problem is shown schematically in FIG. 3. A typical EC or repair involves making a connection to a pin 31 of the MCM 1, the pin being inserted into a hole 30 in the board 2. Pin 31 is connected to pad 32 on the back side 28 of the board 2. A hole 35 is drilled through the board, inside the O-ring seal; a similar hole 36 is outside the O-ring seal. The inside surfaces of holes 35, 36 are metallized, and a conductor 33, embedded in the board 2, extends between holes 35 and 36. Pads 37 and 38, formed on the board surface, surround holes 35 and 36 respectively and are therefore in electrical contact. The EC/repair may then be made by connecting a wire between pads 32 and 37 inside the sealed air space 27, and connecting an external wire to pad 38. It should be noted that this procedure requires drilling two holes in the board 2 to accommodate each EC or repair. This procedure thus greatly increases the complexity and processing time for each circuit board.

Accordingly, there is a need for an improved circuit board arrangement for MCMs which permits both cooling with O-ring sealing and external wiring for ECs and repairs.

SUMMARY OF THE INVENTION

The present invention addresses the above-described need by providing a circuit board structure which facilitates ECs and repairs on the MCM while permitting the MCM to be mounted on the circuit board and hermetically sealed. In accordance with the present invention, this is done by providing a first layer of a conductive material overlying a portion of a surface of the circuit board, and a second layer overlying the first layer and in contact therewith. The second layer has openings therein; bonding pads are formed in the openings of the second layer. The bonding pads are of a conductive material and in contact with the first layer. The multichip module is surrounded by a hermetic seal on the second layer, so that a first bonding pad is inside a hermetically sealed area of the circuit board and a second bonding pad is outside the hermetically sealed area. An engineering change of the multichip module is performed by connecting the multichip module to the first bonding pad by a first wire inside the hermetically sealed area, and by connecting a second wire to the second bonding pad outside the hermetically sealed area. The first layer and the bonding pads are preferably copper. The second layer preferably comprises a solder mask, such as is used in a wave-solder process.

DETAILED DESCRIPTION OF A PREFERRED EMBODIMENT

Figure 4A:
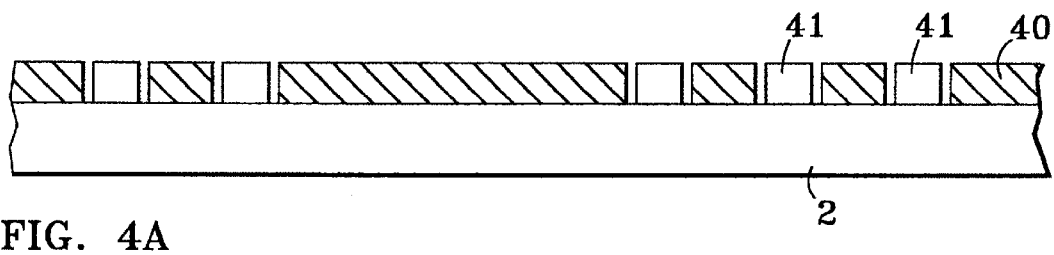
FIGS. 4A and 4B show a solder mask and bonding pads provided on a surface of the circuit board.
Figure 4B:
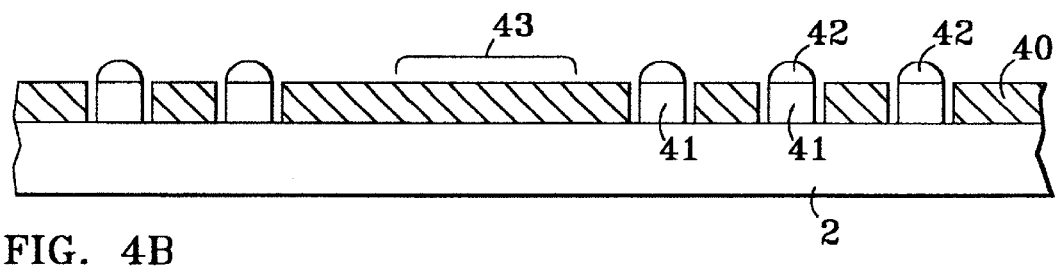
Figure 4C:
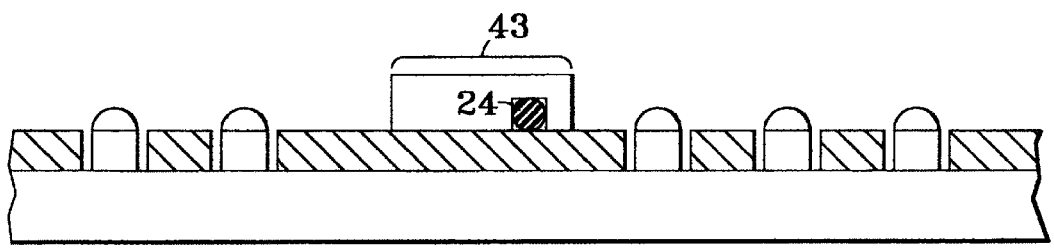
FIG. 4C shows a sealing area of the circuit board surface, where the surface is covered by a portion of the solder mask.

Connection pads, either for standard connections to the MCM or for ECs and repairs, may be formed on the surface of the circuit board using a wave-solder technique. In accordance with this process, a layer of copper is deposited on the board surface, then patterned and etched to form copper pads 41. A solder mask 40 is then deposited on the surface; the solder mask is patterned to provide openings for the pads (see FIG. 4A). After the wave-solder process, solder bumps 42 remain on pads (see FIG. 4B). This embodiment of the invention takes advantage of the fact that the solder mask 40 covers the surface of the circuit board 2 in the area 43 where the O-ring seal is established (see FIG. 4C). Accordingly, the solder mask protects the surface of the circuit board 2 in the sealing area 43.

Figure 5A:
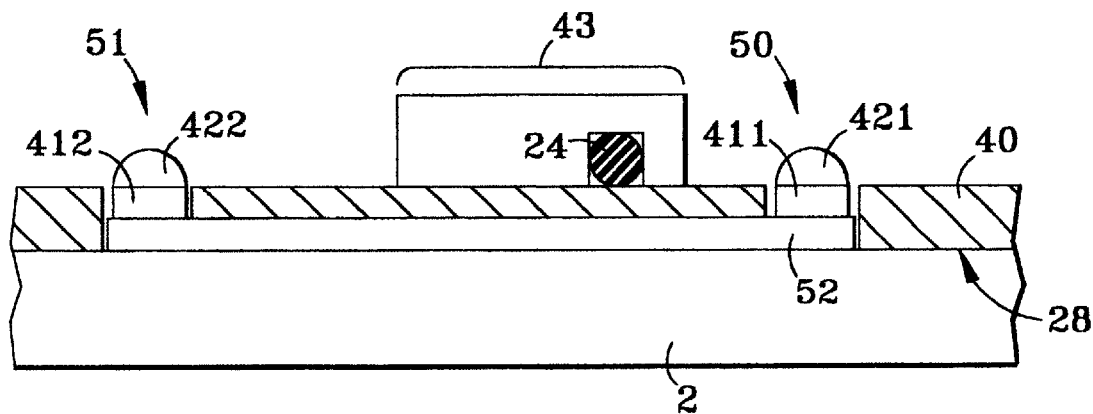
FIG. 5A is a cross-sectional view of the sealing area, showing a conductive strip under the solder mask to connect two bonding pads for EC or repair, in accordance with the present invention.

In this embodiment of the invention, the pattern of the copper is modified to provide strips 52 on the board surface 28, connecting pads 411 and 412 (see FIG. 5A). The solder mask 40, with openings for pads 411 and 412, then overlies the area between the pads, and covers the strip 52. (The solder mask forms a planar surface, so that it has a substantially uniform height above the board surface 28.) Accordingly, the copper strip 52 is buried beneath the solder mask 40 at the sealing area 43. The pads have solder bumps 421 and 422 formed by the wave-solder technique. Wiring for an EC or a repair may thus be routed underneath the O-ring seal, between the module location (the area 50 inside the O-ring seal) and the outside (the area 51 outside the O-ring seal).

Figure 5B:
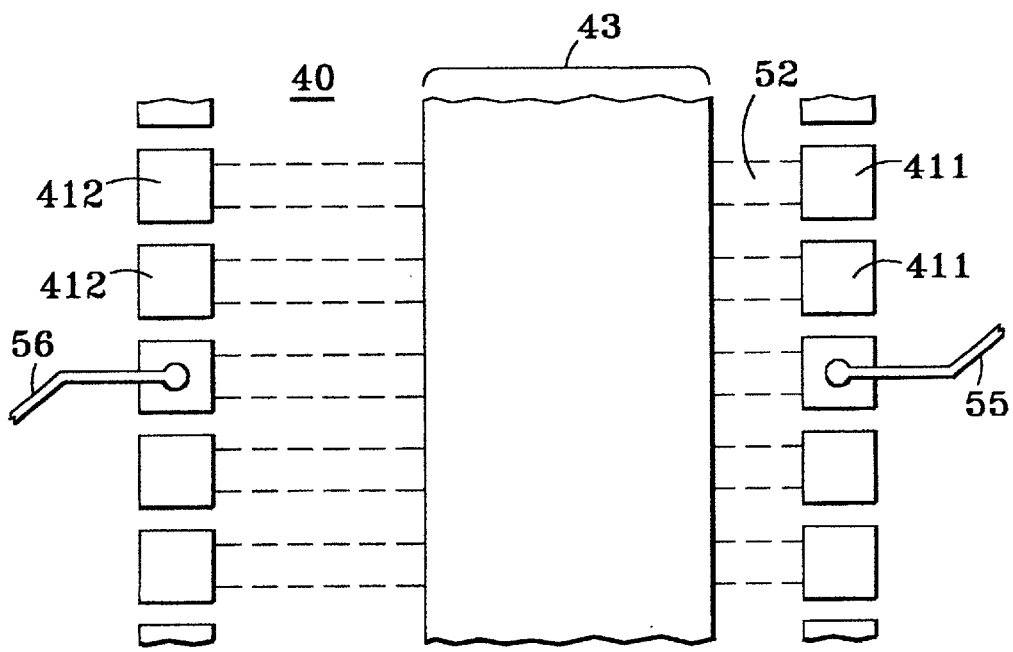
FIG. 5B is a plan view of the arrangement of FIG. 5A.

FIG. 5B is a plan view of a portion of the circuit board surface. An array of bonding pads 411, 412 are formed on the inside and outside, respectively, of the sealing area 43. A corresponding array of copper strips 52, underneath the solder mask 40, are shown by dashed lines. If an EC or repair requires that an external wire be led to the MCM, a wire 55 may be led from the MCM inside the module location and soldered to a pad 411 connected to a copper strip 52, while an external wire 56 is soldered to a pad 412 at the other end of the same copper strip. The external wire may be connected to any desired point outside the module location, including a pad leading to an embedded conductor in the circuit board.

Figure 6:
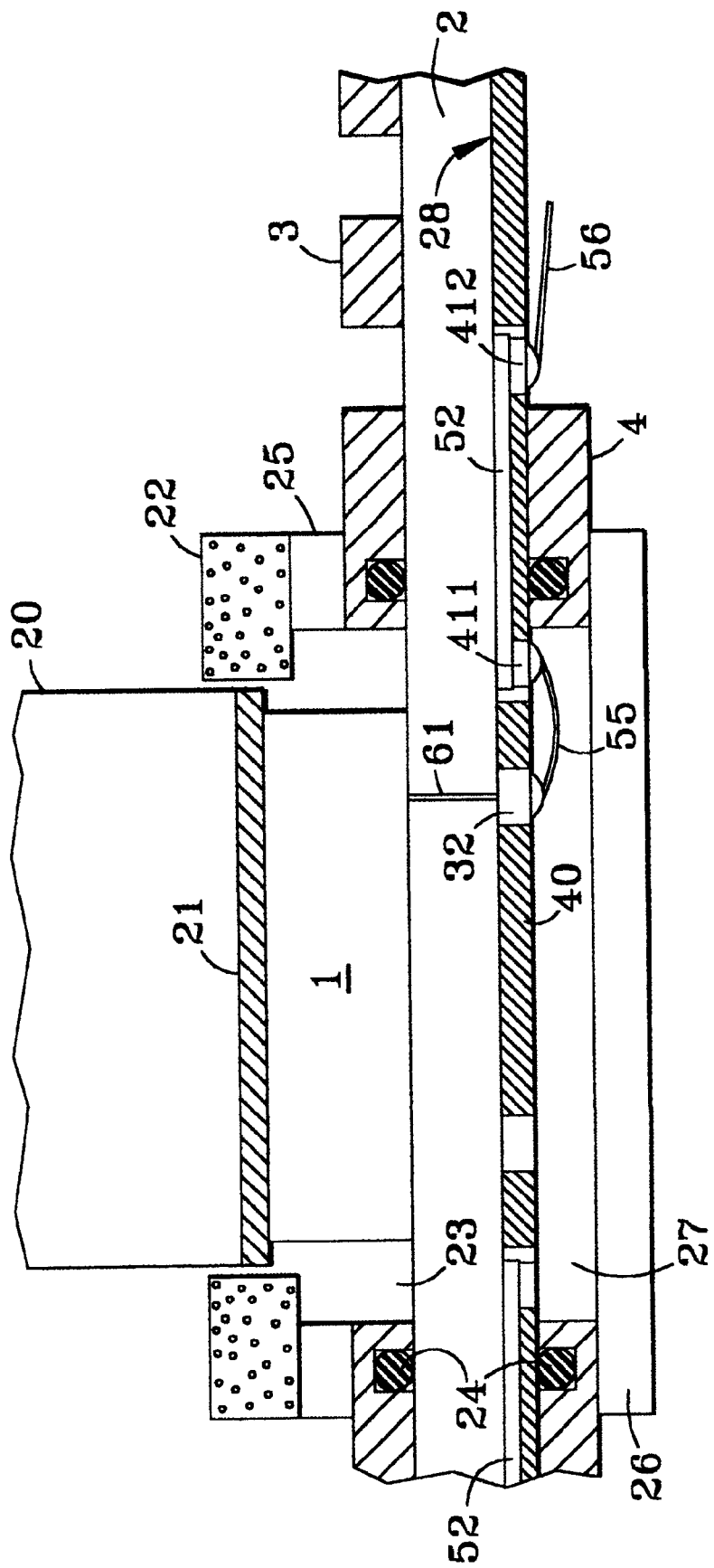
FIG. 6 shows how an EC or repair may be effected in accordance with the present invention.

FIG. 6 shows an arrangement for effecting an EC or repair using the copper strip 52 underneath the solder mask 40 on the back side 28 of circuit board 2. The MCM 1 is connected through the board 2 to bonding pad 32; this connection is shown schematically as 61. EC wire 55 is bonded to pad 32, led through the sealed air space 27, and bonded to pad 411. The connection is made outside the sealing area by bonding external wire 56 to pad 412.

Figure 1:
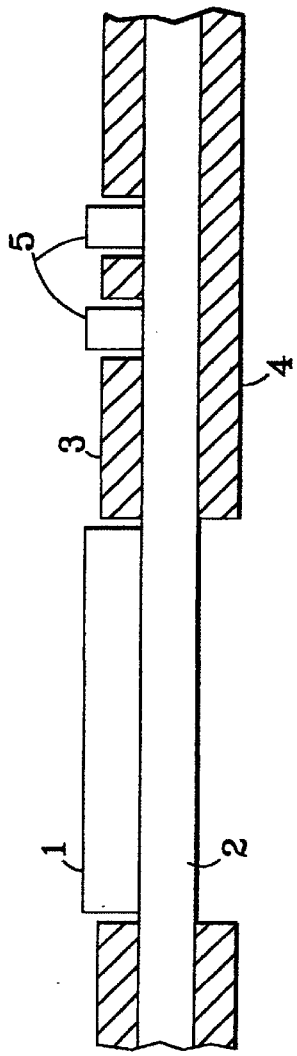
FIG. 1 is a schematic view of a circuit board for multichip modules, mounted between two stiffeners.
Figure 2:
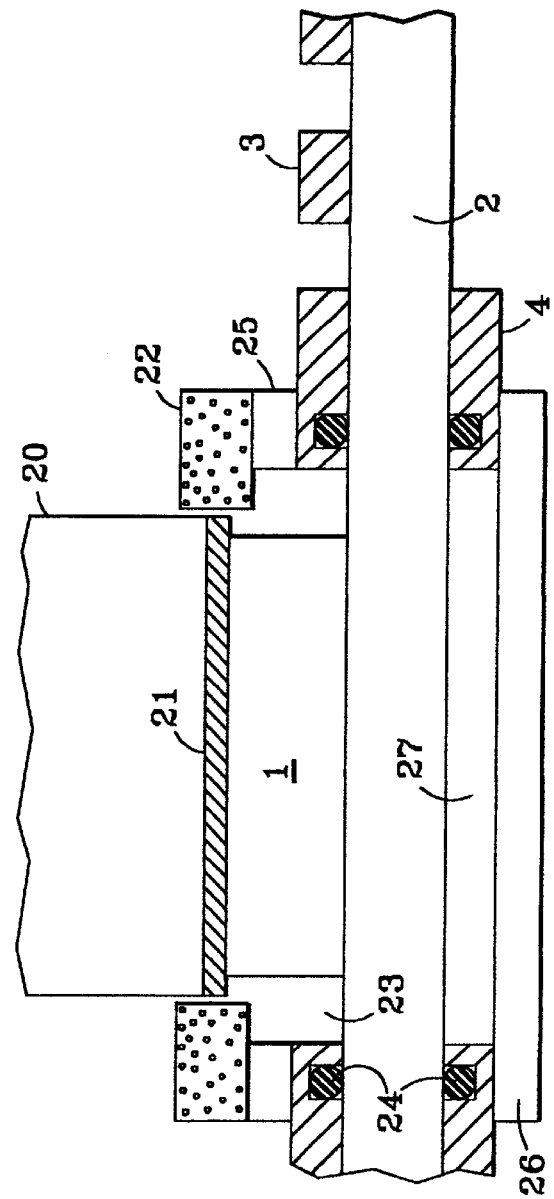
FIG. 2 shows an arrangement for cooling a circuit board, using a liquid cooling assembly and cold plate, with sealed air spaces on both sides of the circuit board.
Figure 3:
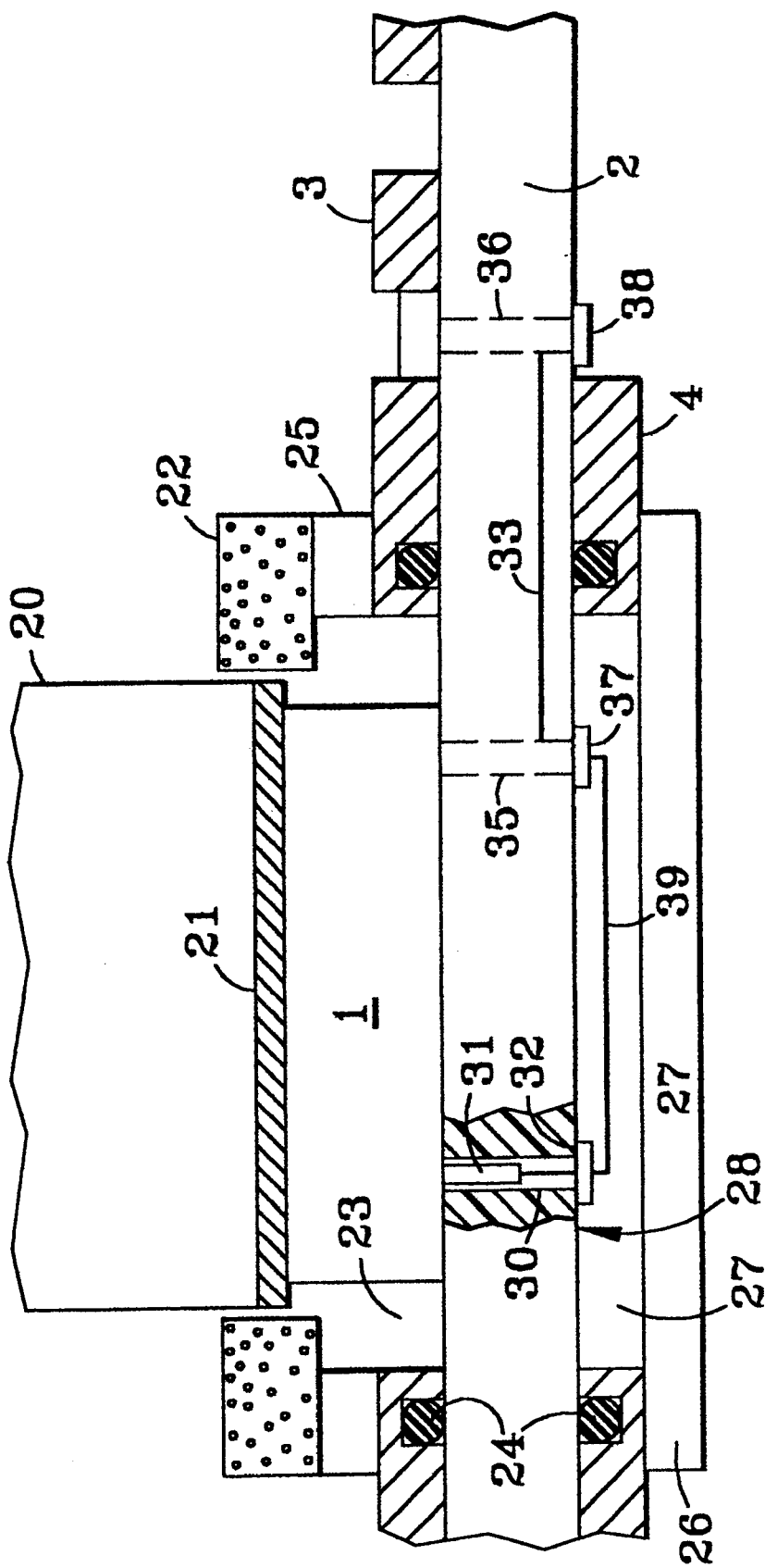
FIG. 3 shows a conventional arrangement for performing an EC or repair when an MCM is mounted and cooled according to the arrangement of FIG. 2.

In this embodiment of the invention, a one-time change to the copper pattern serves to provide all of the buried strips 52; this is far more efficient than drilling holes through the board to accommodate an EC/repair process. By comparing FIG. 6 with FIG. 3, it may be seen that the EC/repair process is greatly simplified, with reduced risk of damage to the circuit board. The overall reliability of the assembly (MCM 1 on circuit board 2, with cooling and EC/repair) is thus considerably enhanced.

While the invention has been described in terms of a specific embodiment, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

I claim:

1. A circuit board structure for facilitating engineering changes for a multichip module mounted on the circuit board, the structure comprising:

a first layer contiguous with a portion of a surface of the circuit board, said first layer being of a conductive material;

a second layer overlying said surface of the circuit board, a portion of said second layer being contiguous with said first layer and a portion of said second layer being contiguous with said surface of the circuit board, said second layer having openings therein; and a first bonding pad and a second bonding pad formed in the openings of said second layer, said first bonding pad and said second bonding pad being of a conductive material and in contact with said first layer, wherein the multichip module is surrounded by a hermetic seal on said second layer so that said first bonding pad is inside a hermetically sealed area of the circuit board and said second bonding pad is outside the hermetically sealed area.

2. A circuit board structure according to claim 1, wherein the second layer comprises a solder mask.

3. A circuit board structure according to claim 1, wherein said first layer, said first bonding pad and said second bonding pad are copper.

4. A circuit board structure according to claim 1, wherein an engineering change of the multichip module is performed by connecting the multichip module to said first bonding pad by a first wire inside the hermetically sealed area, and by connecting a second wire to said second bonding pad outside the hermetically sealed area.

5. A method for facilitating engineering changes for a multichip module mounted on a circuit board, the method comprising the steps of:

providing a first layer contiguous with a portion of a surface of the circuit board, said first layer being of a conductive material;

providing a second layer overlying said surface of the circuit board, a portion of said second layer being contiguous with said first layer and a portion of said second layer being contiguous with said surface of the circuit board, said second layer having openings therein;

forming a first bonding pad and a second bonding pad in the openings of said second layer, said first bonding pad and said second bonding pad being of a conductive material and in contact with said first layer; and establishing a hermetic seal surrounding the multichip module on said second layer, so that the first bonding pad is inside a hermetically sealed area of the circuit board and the second bonding pad is outside the hermetically sealed area.

6. A method according to claim 5, wherein the second layer comprises a solder mask.

7. A method according to claim 5, wherein the first layer, the first bonding pad and the second bonding pad are copper.

8. A method according to claim 5, further comprising the steps of:

connecting the multichip module to said first bonding pad by a first wire inside the hermetically sealed area; and connecting a second wire to said second bonding pad outside the hermetically sealed area, thereby performing an engineering change on the multichip module.

* * * * *